US011058029B2

(12) United States Patent
Saito

(10) Patent No.: US 11,058,029 B2
(45) Date of Patent: Jul. 6, 2021

(54) LIQUID IMMERSION-COOLED ELECTRONIC DEVICE AND LIQUID IMMERSION-COOLED PROCESSOR MODULE

(71) Applicant: ExaScaler Inc., Tokyo (JP)

(72) Inventor: Motoaki Saito, Tokyo (JP)

(73) Assignee: EXASCALER INC., Tokyo (JP)

(*) Notice: Subject to any disclaimer, the term of this patent is extended or adjusted under 35 U.S.C. 154(b) by 0 days.

(21) Appl. No.: 16/612,705

(22) PCT Filed: May 11, 2017

(86) PCT No.: PCT/JP2017/017836
§ 371 (c)(1),
(2) Date: Nov. 11, 2019

(87) PCT Pub. No.: WO2018/207305
PCT Pub. Date: Nov. 15, 2018

(65) Prior Publication Data
US 2020/0120831 A1 Apr. 16, 2020

(51) Int. Cl.
H05K 7/20 (2006.01)
G06F 1/20 (2006.01)

(52) U.S. Cl.
CPC .......... H05K 7/20236 (2013.01); G06F 1/20 (2013.01); G06F 2200/201 (2013.01)

(58) Field of Classification Search
CPC ....... H05K 1/141; H05K 1/14; H05K 7/20236
See application file for complete search history.

(56) References Cited

U.S. PATENT DOCUMENTS 5,131,233 A * 7/1992 Cray .................. G06F 1/20
                                                        165/104.33
9,596,787 B1 * 3/2017 Iyengar ............ H05K 7/20318
(Continued)

FOREIGN PATENT DOCUMENTS

JP 2007066480 A 3/2007
JP 6042587 B1 12/2016
JP 6042590 B1 12/2016

OTHER PUBLICATIONS

International Preliminary Report on Patentability for related PCT App No. PCT/JP2017/017836 dated Nov. 21, 2019, 8 pgs.
(Continued)

Primary Examiner — Mukundbhai G Patel
(74) Attorney, Agent, or Firm — Procopio, Cory, Hargreaves & Savitch LLP

(57) ABSTRACT

A processor module includes a first circuit substrate and a second circuit substrate each having a processor mounting area and a memory mounting area on one surface thereof. One processor is mounted in the processor mounting area, while comb-like arranged memory modules are mounted in the memory mounting area. The surface of the first circuit substrate and the surface of the second circuit substrate are combined face-to-face and positioned such that the processor mounting area and the memory mounting area of the first circuit substrate are placed face-to-face respectively with the processor mounting area and the memory mounting area of the second circuit substrate, and end parts of the plurality of comb-like arranged memory modules of the first circuit substrate and end parts of the plurality of comb-like arranged memory modules of the second circuit substrate are alternately arranged with clearances produced between adjacent memory modules.

4 Claims, 12 Drawing Sheets

(56) References Cited

U.S. PATENT DOCUMENTS

2009/0091883 A1    4/2009  Fukuda et al.
2018/0376611 A1*  12/2018  Madanipour ........ H05K 7/1487

OTHER PUBLICATIONS

Decision to Grant for related JP App No. 2017-541132 dated Feb. 19, 2019, 6 pgs.
International Search Report and Written Opinion for related PCT App No. PCT/JP2017/017836 dated Jul. 18, 2017, 15 pgs.
Press Release dated Mar. 31, 2015, ExaScaler Inc., 7 pgs. X.
Semiconductor, Cooling, Connection Innovated with the Aim of Exa-Class High-Performance Machine (First Part), Nikkei Business Publications, Inc., 1157, Jun. 20, 2015, 13 pgs.
Press Release dated Nov. 17, 2015, ExaScaler Inc., 4 pgs.
Press Release dated Jun. 20, 2016, ExaScaler Inc., 5 pgs.
Extended European Search Report for related EP App No. 179088893 dated Mar. 1, 2021, 10 pgs.

* cited by examiner (A)

(B)

LIQUID IMMERSION-COOLED ELECTRONIC DEVICE AND LIQUID IMMERSION-COOLED PROCESSOR MODULE

CROSS-REFERENCE TO RELATED APPLICATIONS

This application is a U.S. National Stage entry of PCT Application No: PCT/JP2017/017836 filed on May 11, 2017, the contents of which are incorporated herein by reference.

TECHNICAL FIELD

The present invention relates to an electronic device, and, more particularly, to an electronic device which is directly cooled and immersed in a cooling liquid inside a cooling unit. Moreover, the present invention relates to a liquid immersion-cooled processor module to be used preferably for the electronic device. In this specification, in general, the electronic device implies any of those electronic devices requiring superhigh performance or stable operations, such as a supercomputer data center, and generating a large amount of heat, but it is not limited thereto.

BACKGROUND ART

In recent years, one of the largest issues for determining the performance limit of the supercomputer is its consumption power, and the significance of the study related to power saving performance of the supercomputer has widely been recognized. That is, speed performance (Flops/W) per power consumption is one indicator for evaluating the supercomputer. In the data center, approximately 45% of the entire consumption power of the data center is spent for cooling. Thus, there is a great demand for reducing the consumption power by improving cooling efficiency.

The conventional air cooling system and the liquid cooling system are used for cooling the supercomputer or the data center. Because the liquid cooling system uses liquid remarkably more excellent in heat conductive performance than air, it is generally assumed as "high cooling efficiency". Particularly, the liquid immersion-cooled system using a fluorocarbon coolant is attracting attention, and has an advantage that it is excellent in maintenance of (specifically, for example, adjustment, check, repair, exchange, extension, and so on) the electronic device, as compared with any of those using synthetic oil.

The present inventors have already developed a liquid immersion-cooled device which is small and has excellent cooling efficiency, for small-scale liquid immersion-cooled supercomputers. The device is operated and applied to a small-sized supercomputer (Suiren) which is installed and operated in a high energy accelerator research organization (Non-patent literature 1).

The present inventors suggest a various-improved liquid immersion-cooled device which can remarkably increase mounting density in the liquid immersion-cooled electronic device (Patent literature 1, Non-patent literature 2, Non-patent literature 3, Non-patent literature 4).

CITATION LIST

Patent Literature

PATENT LITERATURE 1
Publication of Japanese Patent No. 6042587

Non-Patent Literature

NON-PATENT LITERATURE 1
"A liquid immersion-cooled small-sized supercomputer "ExaScaler-1" measures a value about the world No. 1 value in the latest supercomputer consumption power performance ranking "Green500" by improving the performance by 25% or more", (Mar. 31, 2015), Press Release, ExaScaler Inc. et al.,
URL: http://www.exascaler.co.jp/wp-content/uploads/2015/03/20150331.pdf
NON-PATENT LITERATURE 2
"Semiconductor, Cooling, Connection Innovated with the Aim of Exa-class High-Performance Machine (First Part)", Nikkei Electronics July (2015), pp. 99-105, (Jun. 20, 2015), issued by Nikkei Business Publications, Inc.
NON-PATENT LITERATURE 3
"While maximizing the merit of liquid immersion cooling by high efficiency/high density/low temperature operation, publish a new generation liquid immersion-cooled system "ZettaScaler-1.5" that can arbitrarily change the various configurations and scales of Brick, in SC15", Nov. 17 (2015), Press Release, ExaScaler, Inc.,
URL: http//www.exascaler.co.jp/wp-content/uploads/2015/11/20151117.pdf
NON-PATENT LITERATURE 4
"Supercomputer "Shoubu" won a first place in the world for three consecutive terms in the energy-saving rankings Green 500 of supercomputers, "Satsuki" won a second place, and the supercomputers installed by RIKEN won a first place and a second place", Jun. 20 (2016), Press Release, ExaScaler, Inc., et al.
URL: http://www.exascaler.co.jp/wp-content/uploads/2016/06/20160620_1.pdf

SUMMARY OF INVENTION

Technical Problem

Of the above citation literatures, Non-patent literature 3 discloses a liquid immersion-cooled electronic device "Multi-Xeon Server Brick" which has sixteen Xeon processors ("Xeon" is a trademark of Intel Corporation) possibly with high density. According to this technique, two Xeon processors are connected in accordance with QPI (Quick-Path Interconnect of Intel Corporation). As a result, one electronic device is configured to include eight Multi-Xeon server nodes. Eight 16 GB or 32 GB DDR4 (Double-Data-Rate 4) VIP DIMMs (Very Low Profile Dual Inline Memory Modules), as ultra-low profile memory modules, can be mounted as memories per single processor. Patent literature 1 discloses a configuration example of a group of substrates for realizing the liquid immersion-cooled electronic device disclosed in Non-patent literature 3.

As described above, the liquid immersion-cooled electronic device disclosed in Non-patent literature 3 has 32 GB DDR4 VLP DIMMs, as ultra-low profile memory modules, mounted thereon. It may be requested to increase the memory capacity per processor. To satisfy this request, there is considered a method of increasing the number of memory modules of 32 GB DIMMs or mounting the memory modules with larger capacity, for example, 64 GB DIMMs. However, when to increase the number of memory modules, it is necessary to increase the mounting area on the substrate for mounting the memory modules, and it increases the size of the substrate and also the coupling body of the group of substrates, that is, the volume of the Brick. This causes a problem of lowering the mounting density. On the other hand, when the 64 GB DIMMs with larger capacity are mounted, because the general 64 GB DIMMs have a standard height taller than VLP, the distance between the substrates needs to be secured, in order to avoid that the memory modules interfere with the surface of another substrate. Thus, the volume of the brick is increased, causing a problem of lowering the mounting density.

In the electronic device to be applied to the liquid immersion-cooled device, it is demanded to develop an electronic device with a new configuration and a processor module with a new configuration preferably for use in the electronic device. That is, in the new configuration, the mounting density is not lowered even if mounting memory modules with a standard height or relatively high memory modules, or the mounting density can further be enhanced.

In addition, in the processor module, it is demanded to develop a technique for making use of the space which can be creased inside the processor module.

Solution to Problem

To solve the above problems, according to one aspect of the present invention, there is provided a liquid immersion-cooled processor module applicable to an electronic device which is directly immersed and cooled in a cooling liquid inside a cooling unit, the module comprising:

a first circuit substrate and a second circuit substrate each of which has a processor mounting area and a memory mounting area on one surface of the first circuit substrate and the second circuit substrate, and each of which has at least one processor mounted in the processor mounting area, and each of which has a plurality of comb-like arranged memory modules mounted in the memory mounting area, and which are in a state that the one surface of the first circuit substrate and the one surface of the second circuit substrate are combined face-to-face; and a connector which electrically connects between the first circuit substrate and the second circuit substrate, and wherein the first circuit substrate and the second circuit substrate are positioned in manners, that the processor mounting area and the memory mounting area of the first circuit substrate are placed face-to-face respectively with the processor mounting area and the memory mounting area of the second circuit substrate, and that end parts of the plurality of comb-like arranged memory modules of the first circuit substrate and end parts of the plurality of comb-like arranged memory modules of the second circuit substrate are alternately arranged with clearances made between adjacent memory modules.

In the preferred embodiment of the liquid immersion-cooled processor module according to the one aspect of the present invention, the memory mounting area may include a plurality of memory sockets for fixing individual memory modules, and a distance H between the one surface of the first circuit substrate and the one surface of the second circuit substrate may satisfy $(h_1+h_2)<H<2h_1$ where "$h_1$" is a height of the memory module from the one surface and "$h_2$" is a height of the memory socket.

In the preferred embodiment of the liquid immersion-cooled processor module according to the one aspect of the present invention, the memory module may be a memory module with a standard height, and the memory module is inserted into the memory socket in such a manner that a substrate surface of the memory module is vertical to or oblique against the one surface.

In the preferred embodiment of the liquid immersion-cooled processor module according to the one aspect of the present invention, the processor of the first circuit substrate and the processor of the second circuit substrate may be connected through an inter-processor connecting interface.

According to another aspect of the present invention, there is provided an electronic device which is directly immersed and cooled in a cooling liquid in a cooling device, comprising:

a carrier substrate which includes a voltage input end for supplying a DC voltage for the electronic device, the voltage input end being electrically connected to a voltage output end of a power supply unit;

a plurality of module connectors which are arranged on one surface of the carrier substrate;

a plurality of processor modules each of which has a module connector plug electrically coupled to each of the plurality of module connectors; and a support member which supports the carrier substrate to be positioned in an upper section of the power supply unit arranged on a bottom section of a cooling tank included in the cooling device, when the electronic device is electrically connected to the power supply unit, and wherein the processor module includes a first circuit substrate and a second circuit substrate each of which has a processor mounting area and a memory mounting area on one surface thereof, each of which has at least one processor mounted in the processor mounting area, and each of which has a plurality of comb-like arranged memory modules in the memory mounting area, and which are in a state that the one surface of the first circuit substrate and the one surface of the second circuit substrate are combined face-to-face; and a connector which electrically connects between the first circuit substrate and the second circuit substrate, and wherein the first circuit substrate and the second circuit substrate are positioned in manners, that the processor mounting area and the memory mounting area of the first circuit substrate are placed face-to-face respectively with the processor mounting area and the memory mounting area of the second circuit substrate, and that end parts of the plurality of comb-like arranged memory modules of the first circuit substrate and end parts of the plurality of comb-like arranged memory modules of the second circuit substrate are alternately arranged with clearances made between adjacent memory modules.

In the preferred embodiment of the electronic device according to the another aspect of the present invention, the support member may include a backboard or a frame structure on which the carrier substrate is fixed.

In the preferred embodiment of the electronic device according to the another aspect of the present invention, the backboard or the frame structure may be slidably supported by a plurality of support columns which stand up and are vertically fixed in the cooling tank.

According to still another aspect of the present invention, there is provided a liquid immersion-cooled processor module applicable to an electronic device which is directly immersed and cooled in a cooling liquid in a cooling device, comprising:

a first circuit substrate and a second circuit substrate each of which has a processor mounting area and a memory mounting area on one surface thereof, each of which has at least one processor mounted in the processor mounting area, and each of which has a plurality of comb-like arranged memory modules in the memory mounting area, and which are in a state that the one surface of the first circuit substrate and the one surface of the second circuit substrate are combined face-to-face;

a first connector which electrically connects between the first circuit substrate and the second circuit substrate;

a third circuit substrate which is arranged between the first circuit substrate and the second circuit substrate; and a second connector which electrically connects between the third circuit substrate and the first circuit substrate or the second circuit substrate, wherein the first circuit substrate and the second circuit substrate are positioned in manners, that the processor mounting area and the memory mounting area of the first circuit substrate are placed face-to-face respectively with the processor mounting area and the memory mounting area of the second circuit substrate, and that end parts of the plurality of comb-like arranged memory modules of the first circuit substrate and end parts of the plurality of comb-like arranged memory modules of the second circuit substrate are alternately arranged with clearances made between adjacent memory modules, and the third circuit substrate is arranged in a space which is produced between opposingly arranged upper surfaces of the processors of the first circuit substrate and the second circuit substrate.

In the liquid immersion-cooled processor module according to the still another aspect of the present invention, the memory mounting area may include a plurality of memory sockets for fixing individual memory modules, and a distance H of the one surface of the first circuit substrate and the one surface of the second circuit substrate may satisfy $(h_1+h_2)<H<2h_1$ where "$h_1$" is a height of the memory module from the one surface, and "$h_2$" is a height of the memory socket.

In the preferred embodiment of the liquid immersion-cooled processor module according to the still another aspect of the present invention, the memory module may be a memory module with a standard height, and the memory module may be inserted into the memory socket in such a manner that a substrate surface of the memory module is vertical to or oblique against the one surface.

In the preferred embodiment of the liquid immersion-cooled processor module according to the still another aspect of the present invention, the processor of the first circuit substrate and the processor of the second circuit substrate may be connected through an inter-processor connecting interface.

In the preferred embodiment of the liquid immersion-cooled processor module according to the still another aspect of the present invention, the third circuit substrate may be a circuit substrate on which a storage device and/or an I/O control chip set are/is mounted.

According to still yet another aspect of the present invention, an electronic device which is directly immersed and cooled in a cooling liquid in a cooling device, comprising:

a carrier substrate which includes a voltage input end for supplying a DC voltage for the electronic device, the voltage input end being electrically connected to a voltage output end of a power supply unit;

a plurality of module connectors which are arranged on one surface of the carrier substrate;

a plurality of processor modules each of which has a module connector plug electrically coupled to each of the plurality of module connectors; and a support member which supports the carrier substrate to be positioned in an upper section of the power supply unit arranged on a bottom section of a cooling tank included in the cooling device, when the electronic device is electrically connected to the power supply unit, and wherein the processor module includes a first circuit substrate and a second circuit substrate each of which has a processor mounting area and a memory mounting area on one surface thereof, each of which has at least one processor mounted in the processor mounting area, and each of which has a plurality of comb-like arranged memory modules in the memory mounting area, and which are in a state that the one surface of the first circuit substrate and the one surface of the second circuit substrate are combined face-to-face, a first connector which electrically connects between the first circuit substrate and the second circuit substrate, a third circuit substrate which is arranged between the first circuit substrate and the second circuit substrate, and a second connector for electrically connecting between the third circuit substrate and the first circuit substrate or the second circuit substrate, and the first circuit substrate and the second circuit substrate are positioned in manners, that the processor mounting area and the memory mounting area of the first circuit substrate are placed face-to-face respectively with the processor mounting area and the memory mounting area of the second circuit substrate, and that end parts of the plurality of comb-like arranged memory modules of the first circuit substrate and end parts of the plurality of comb-like arranged memory modules of the second circuit substrate are alternately arranged with clearances made between adjacent memory modules, and the third circuit substrate is arranged in a space produced between opposingly arranged upper surfaces of the processors of the first circuit substrate and the second circuit substrate.

When to combine face-to-face the one surface of the first circuit substrate and the one surface of the second circuit substrate, to avoid interfering between the memory modules, the distance between the substrates needs to be longer than twice the height "$h_1$" of the memory module from the corresponding one surface. According to the present invention, the first circuit substrate and the second circuit substrate are positioned in manners, that the processor mounting area and the memory mounting area of the first circuit substrate are placed face-to-face respectively with the processor mounting area and the memory mounting area of the second circuit substrate, and that end parts of the plurality of comb-like arranged memory modules of the first circuit substrate and end parts of the plurality of comb-like arranged memory modules of the second circuit substrate are alternately arranged with clearances made between adjacent memory modules. This enables to solve the problem of the interfere between the memory modules, thus enabling to realize super-high density mounting of the processors and memory modules in a very small volume. For example, when the memory mounting area includes a plurality of memory sockets into which individual memory modules are inserted, a distance H between the one surface of the first circuit substrate and the one surface of the second circuit substrate can be made short to satisfy $(h_1+h_2)<H<2h_1$ where "$h_1$" is a height of the memory module from the one surface, and "$h_2$" is a height of the memory socket. Note that the top ends of the plurality of memory modules are alternately arranged with clearances made between the adjacent memory modules. Thus, the cooling liquid absorbs heat from the surface of the memory modules through the clearances. An amount of heat from the memory modules is far lower than that of the processors. Thus, even if the clearances between the adjacent memory modules are relatively narrow, a heating-absorbing action using the cooling liquid is not impaired.

In the configuration of the processor mounted in the liquid immersion-cooled module, generally, the heat spreader on the upper surface of the processor (the processor having the heat spreader incorporated therewith is commercially available) and the heat sink are thermally connected. Thus, the cooling liquid flowing thereon can efficiently absorb the heat from the processors. At the time of air cooling, it is necessary to increase the height of fins of the heat sink to attain a relatively high heat radiation area. In contrast to this, according to the liquid immersion cooling, the heat-absorbing efficiency using the cooling liquid is excellent. Thus, the height of the fins of the heat sink may be low. Therefore, the height from the one surface of the first or second circuit substrate up to the upper surface of the processor including the heat spreader and the heat sink can be lower than the height "$h_1$" of the memory module from this one surface. According to the present invention, using this difference in height, when the one surface of the first circuit substrate and the one surface of the second circuit substrate are combined face-to-face, the third circuit substrate is arranged in a relatively large space which is produced between opposingly arranged upper surfaces of the processors. As a result, using the space which can be produced inside the processor module, the functions of the processor modules can be expanded or enhanced. Because another circuit substrate is arranged in an extra space inside the processor module, it is possible to realize further super-high density mounting.

The cooling tank having an "open space" in this specification includes any cooling tank having a simple sealing structure at a level without impairing the maintainability of the electronic device. For example, at the opening part of the cooling tank, a simple sealing structure may include the structure enabling to put a top plate for closing the open space of the cooling tank or the structure enabling to detachably attach the top plate through the packing.

The above-described objects and advantages of the present invention, and any other purposes and advantages thereof will more clearly comprehended through the descriptions of the following preferred embodiment. The preferred embodiment described later is only an example, and thus the present invention is not limited thereto.

BRIEF DESCRIPTIONS OF DRAWINGS

DESCRIPTION OF EMBODIMENTS

Detailed descriptions will hereinafter be made to a preferred embodiment of an electronic device and a liquid immersion-cooled processor module according to the present invention, based on the drawings.

Figure 1:
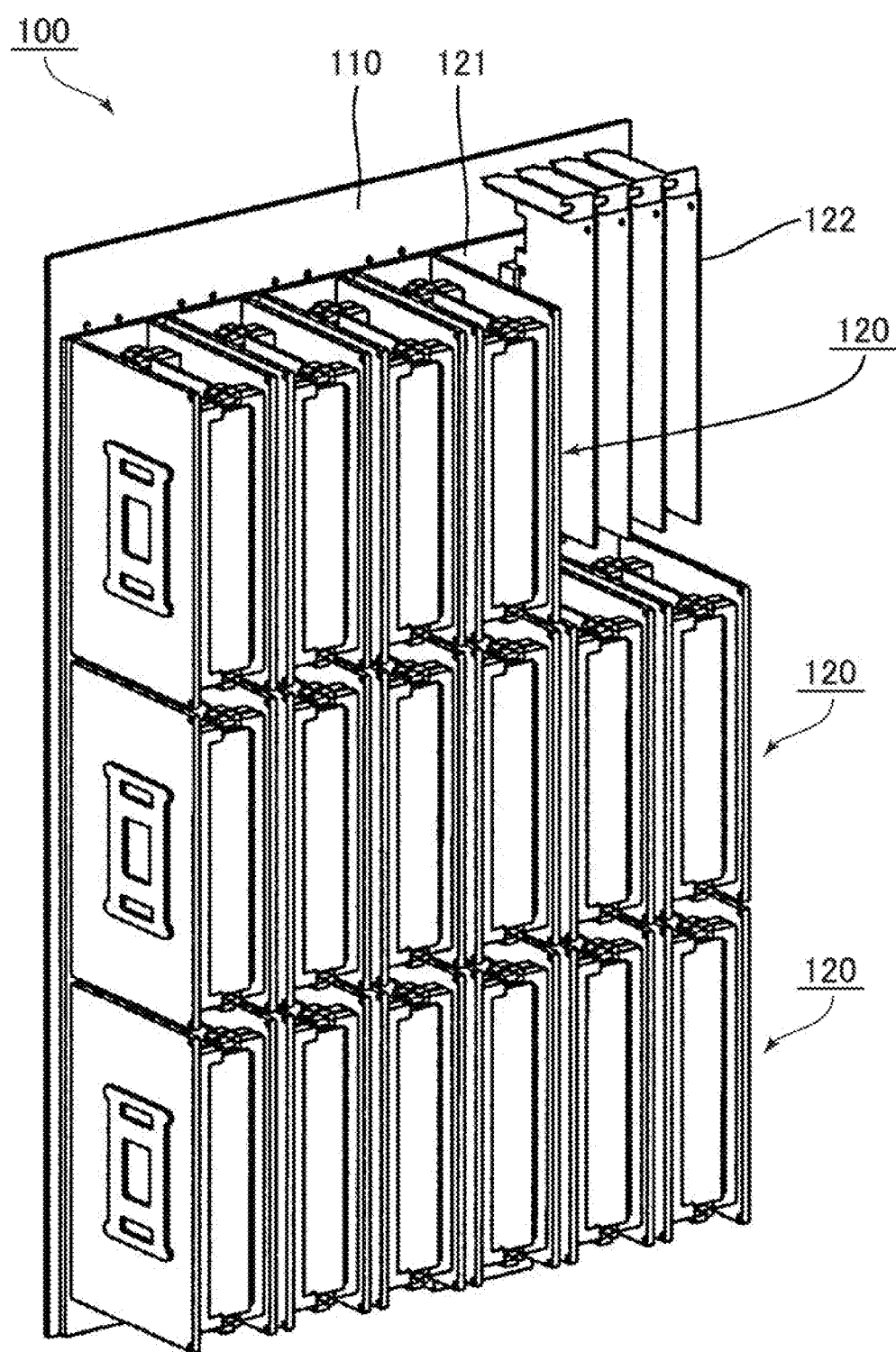
FIG. 1 is a perspective diagram of an electronic device according to an embodiment of the present invention.
Figure 2:
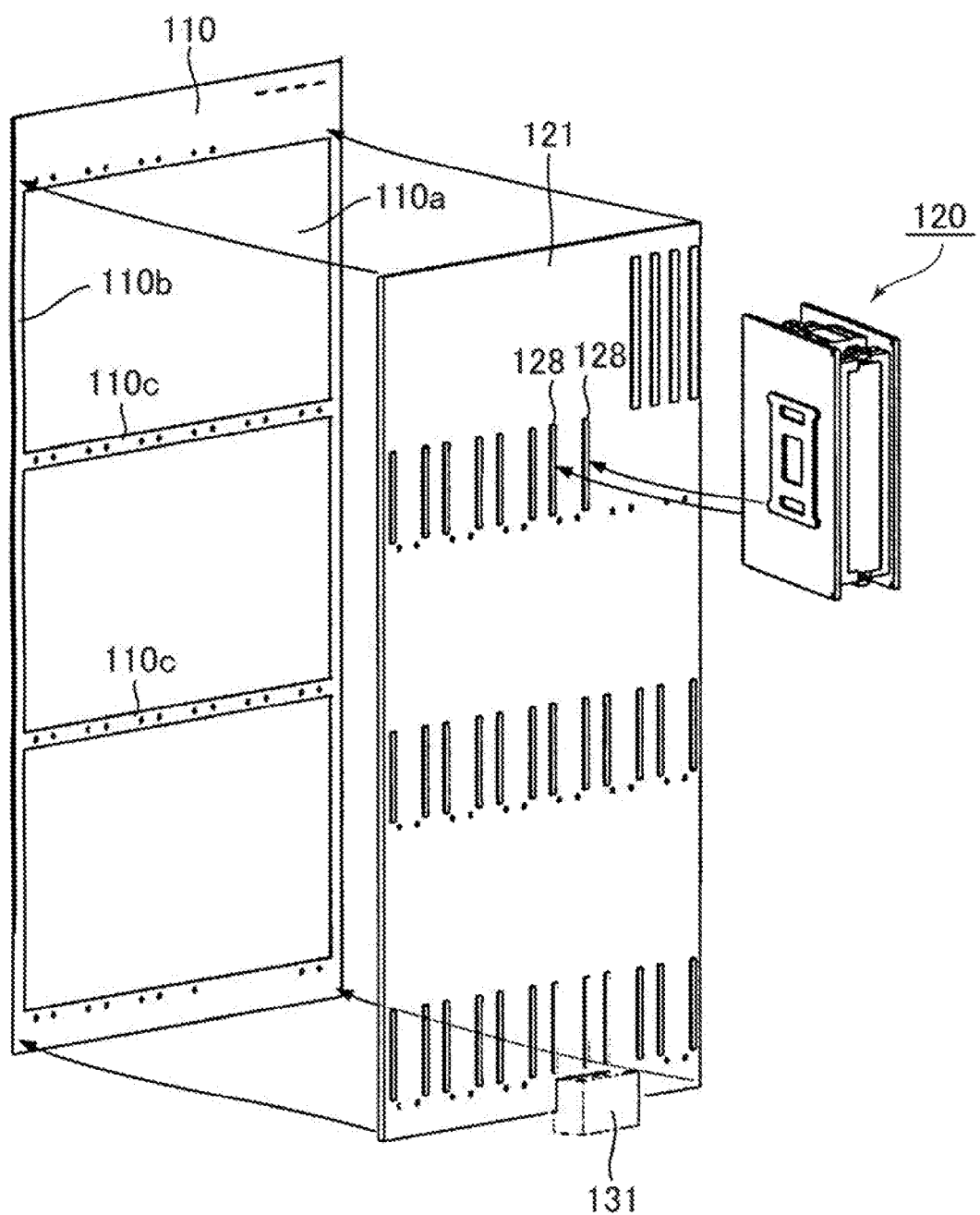
FIG. 2 is a partial assembly diagram of the electronic device according to the embodiment of the present invention, and an assembly diagram of a backboard or a frame structure, a carrier substrate, and a processor module.

By reference to FIG. 1 and FIG. 2, an electronic device 100 according to the embodiment of the present invention will be described. FIG. 1 is a perspective diagram of the electronic device 100 according to the embodiment of the present invention, and FIG. 2 is a partial assembly diagram thereof. The electronic device 100 is an electronic device which is immersed and directly cooled in cooling liquid in a cooling unit, as will be described later. The electronic device 100 includes a backboard or frame structure 110 (hereinafter simply referred to as "backboard 110"), a plurality of processor modules 120, a carrier substrate 121, and network cards 122. As illustrated, the power supply unit is abolished from the electronic device 100. As will be described later, the power supply unit is installed on the bottom of the cooling tank included in the cooling device. In FIG. 2, only one processor module 120 is illustrated, and no network card is illustrated.

The backboard 110 forms a support member supporting the carrier substrate 121. The backboard 110 is formed of, as illustrated in 2, an outer frame section 110b and a beam section 110c crossing inside the outer frame section 110b in a width direction. On the upper part of the outer frame 110b, there may be formed hanging metal fitting holes (not illustrated) for passing hanging tools at the time of putting in or taking out the electronic device 100 from the cooling tank. The backboard 110 may include a pair of support pins or guide pins (hereinafter referred simply to as "support pin") extending downward from the lower part of the outer frame section 110b. A plurality of support plates (not illustrated) may be attached to the outer frame section 110b and the beam section 110c, through fastening tools, such as screws, penetrating through the carrier substrate 121. Then, the carrier substrate 121 can be fixed to one surface of the backboard 110, and the plurality of support plates (not illustrated) can be attached at a predetermined interval in a longitudinal direction of the carrier substrate 121. In each of the support plates (not illustrated), a plurality of grooves are formed, and each of end parts of the plurality of processor modules 120 is inserted to each of the plurality of grooves. In this manner, the adjacent support plates (not illustrated) may preferably support the upper and lower ends of the plurality of processor modules 120.

The lower part of the carrier substrate 121 includes a direct current voltage input connector 131 for supplying a direction current voltage for electronic devices. The direct current voltage input connector 131 is equivalent to a voltage input end included in the carrier substrate 121. A plurality of modules connectors 128 are arranged on one surface of the carrier substrate 121. As will be described later by reference to illustrations from FIG. 3A, each of the plurality of processor modules 120 has a pair of module connector plugs 129 which are electrically coupled to each pair of a plurality of module connectors 128. Thus, it is possible to insert and pull out each processor module 120 into and from the carrier substrate 121. In the example of the illustration, four network cards 122 are attached to the carrier substrate 121. Sixteen processor modules 120 are attached to the carrier substrate 121. However, number of processor modules 120 is arbitrary, and is not particularly limited.

By reference to FIG. 3A to FIG. 5B, the processor module 120 will specifically be described. The processor module 120 includes a first circuit substrate 123A, a second circuit substrate 123B, and connectors 125A and 125B electrically connecting between the first circuit substrate 123A and the second circuit substrate 123B. The processor module 120 includes a third circuit substrate 123C and connectors 125C and 125D electrically connecting between the third circuit substrate 123C and the first circuit substrate 123A, but may not include them as necessary.

Figure 3A:
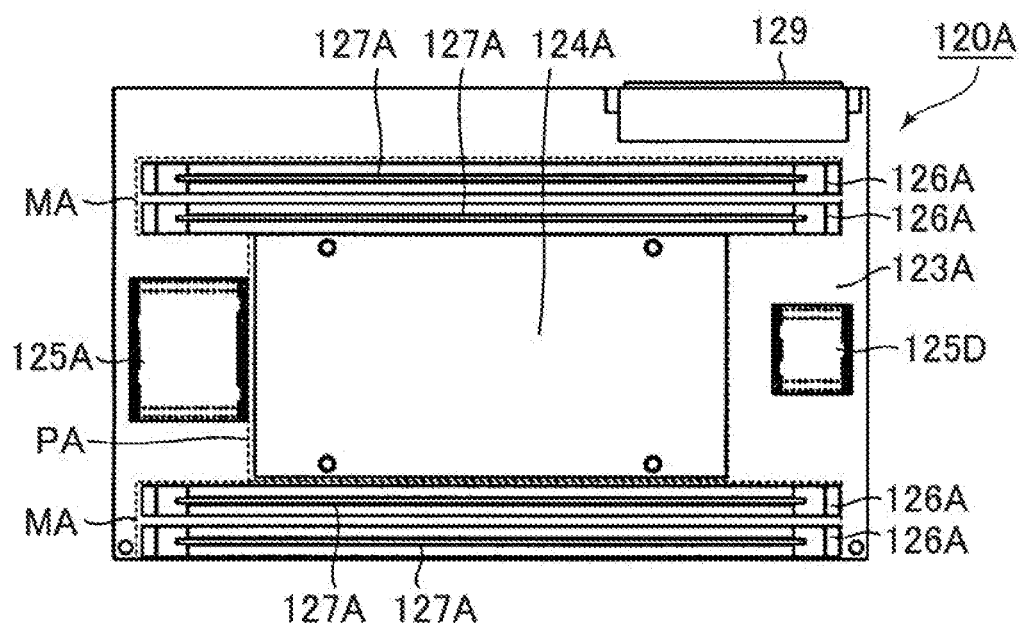
FIG. 3A is a plan view illustrating an example of a first circuit substrate, of the processor module included in the electronic device according to the embodiment of the present invention.

As illustrated in FIG. 3A, the first circuit substrate 123A has, on one surface thereof, a processor mounting area PA positioned near the center of the substrate and two memory mounting areas MA positioned on both sides of the processor mounting area PA. In the processor mounting area PA, at least one processor 124A is mounted. Though no particular limitation is made, the processor 124A may, for example, be a Xeon processor ("Xeon" is a trademark of Intel Corporation) produced by Intel Corporation. The processor 124A may have a backplate, a socket, a heat spreader (may be incorporated with the processor 124A) thermally connected to the upper surface of the processor 124A, and a heat sink (see FIG. 5B). In FIG. 3A, the fins of the heat sink are not illustrated, nor the heat spreader under the heat sink is illustrated. In this case, to coincide with the flow direction of the cooling liquid, the arrangement direction of the fins of the heat sink may preferably be the same as memory modules, as will be described later.

In each of the two memory mounting areas, two comb-like arranged memory modules 127A are mounted. The number of memory modules 127A mounted in the memory mounting areas MA may be two or more than two. The memory module 127A may be general 64 GB DIMM64 with a standard height rather than the VIP modules, in accordance with the purpose of the present invention. As illustrated, a necessary number of general memory sockets 126A may be attached at a predetermined interval to the substrate, and the memory module 127A may be inserted into each of the memory sockets 126A. One surface of the first circuit substrate 123A has a connector 125A for electrically connecting with the second circuit substrate 123B, a connector for electrically connecting with the third circuit substrate 123B, and one of a pair of module connector plugs 129 coupled to one of the pair of module connector plugs 129. Other than the above constituent parts, on the one surface of the first circuit substrate 123A, various electronic parts are mounted, but these corresponding parts are not illustrated. The first circuit substrate 123A having this configuration and the constituent parts mounted thereon may hereinafter be entirely referred to as "A substrate 120A".

Figure 3B:
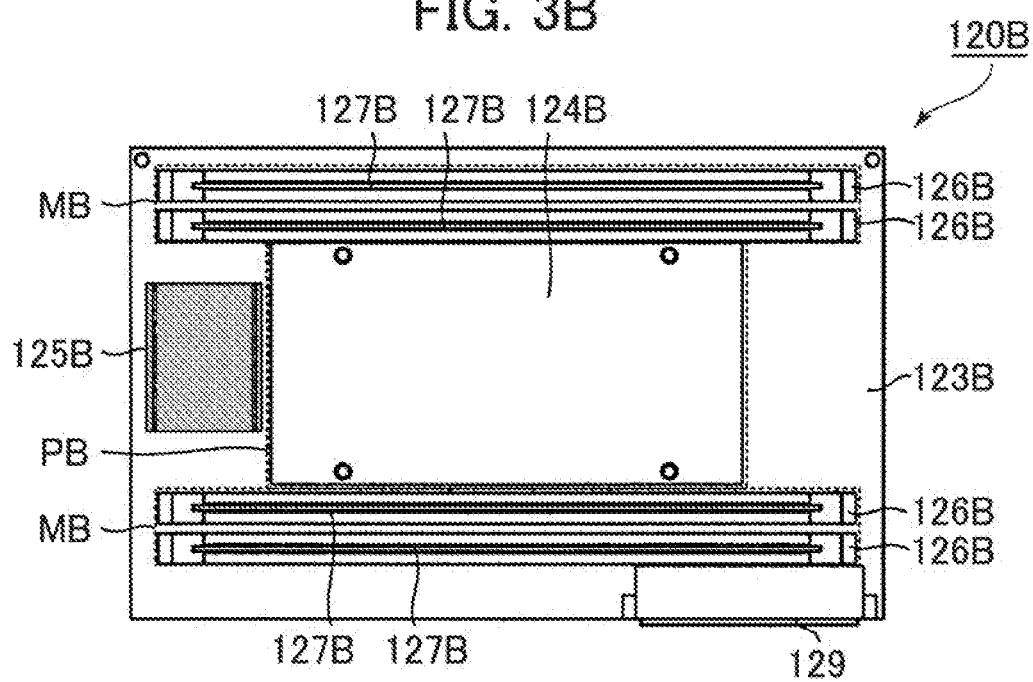
FIG. 3B is a plan view illustrating an example of a second circuit substrate, of the processor module included in the electronic device according to the embodiment of the present invention.

As illustrated in FIG. 3B, the second circuit substrate 123B has the configuration similar to that of the first circuit substrate 123A. Particularly, the second circuit substrate 123B has, on the one surface thereof, a processor mounting area PB positioned near the center of its substrate and two memory mounting area MB positioned on both sides of the processor mounting area PB. On the processor mounting area PB, at least one processor 124B is mounted. The processor 124B is the same as the processor 124A, and thus will not be described herein.

On each of the two memory mounting areas MB, two comb-like arranged memory modules 127B are mounted. The number of memory modules 127B mounted on the memory mounting area MB may be two or more than two. Note that the memory modules 127B and the memory sockets 126B are the same as the memory modules 127A and the memory sockets 126A, thus will not be described herein. One surface of the second circuit substrate 123B has the connector 125B for electrically connecting with the first circuit substrate 123A and the other one of the pair of the module connector plugs 129 which is coupled to the other one of the pair of the module connectors 128 of the carrier substrate 121. On the one surface of the second circuit substrate 123B, other than the above constituent parts, various electronic parts are mounted, but these corresponding parts are not illustrated. The second circuit substrate 123B having this configuration and the constituent parts mounted thereon may hereinafter be entirely referred to as "B substrate 120B".

As obvious from in comparison between FIG. 3A and FIG. 3B, the size of the first circuit substrate 123A is the same as that of the second circuit substrate 123B. In addition, positions of the processor mounting area PA of the first circuit substrate 123A, the memory mounting area MA, and positions of the processor mounting area PB of the second circuit substrate 123B, the memory mounting area MB, and the module connector plug 129 are approximately vertically symmetrical. Note that the processor mounting area PB and the second circuit substrate 123B and the memory mounting area MB entirely shift a little close to the center (lower side) of the substrate. This is to alternately arrange (see FIG. 5B) the end parts of the plurality of comb-like arranged memory modules 127A of the first circuit substrate 123A and the end parts of the plurality of comb-like arranged memory modules 127B of the second circuit substrate 123B with clearances made between the adjacent memory modules. This arrangement is made when the one surface of the first circuit substrate 123A and the one surface of the second circuit substrate 123B are combined face-to-face respectively with each other, if the processor areas and the memory mounting areas are brought closely face-to-face, while the four corners of the first circuit substrate 123A correspond to the four corners of the second circuit substrate 123B. As a result, it is possible to avoid interference of the memory modules with each other.

Figure 3C:
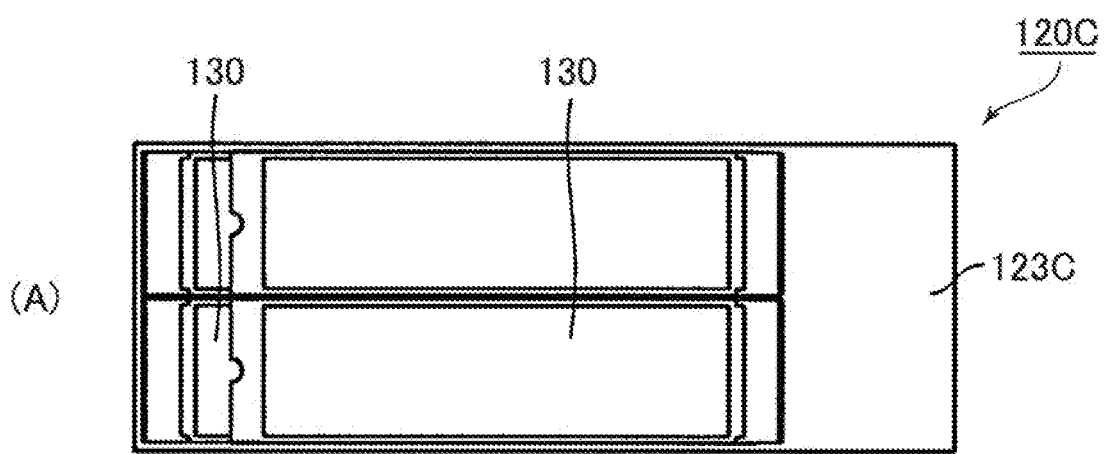
FIG. 3C (A) is a plan view, and (B) is a side view, illustrating an example of a third circuit substrate, of the processor module included in the electronic device according to the embodiment of the present invention.
Figure 3C:
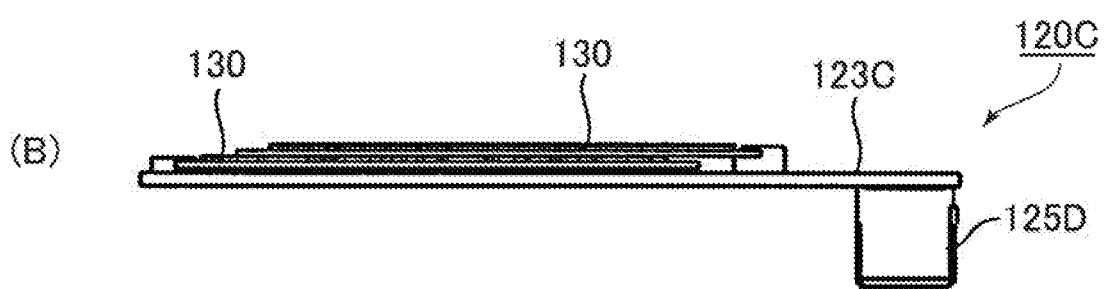

As illustrated in FIG. 3C, the third circuit substrate 123C has four storage devices 130 on one surface thereof, and has the connector 125D for electrically connecting with the first circuit substrate 123A on the other surface of the substrate.

The third circuit substrate 123C may alternatively or additively have an I/O control chip set mounted thereon. The third circuit substrate 123C may alternatively or additively have a programmable logic display mounted thereon. The storage device 130 may employ a flash storage, for example, an M.2 SSD (Solid State Drive) or an mSATA (mini Serial ATA) SSD. The programmable logic device may employ an FPGA (Field-Programmable Gate Array). On the one surface of the third circuit substrate 123C, other than the above constituent parts, various electronic parts are mounted, but the corresponding parts are not illustrated. The second circuit substrate 123C having this configuration and the constituent parts mounted thereon may hereinafter be entirely referred to as "C substrate 120 C".

Figure 4:
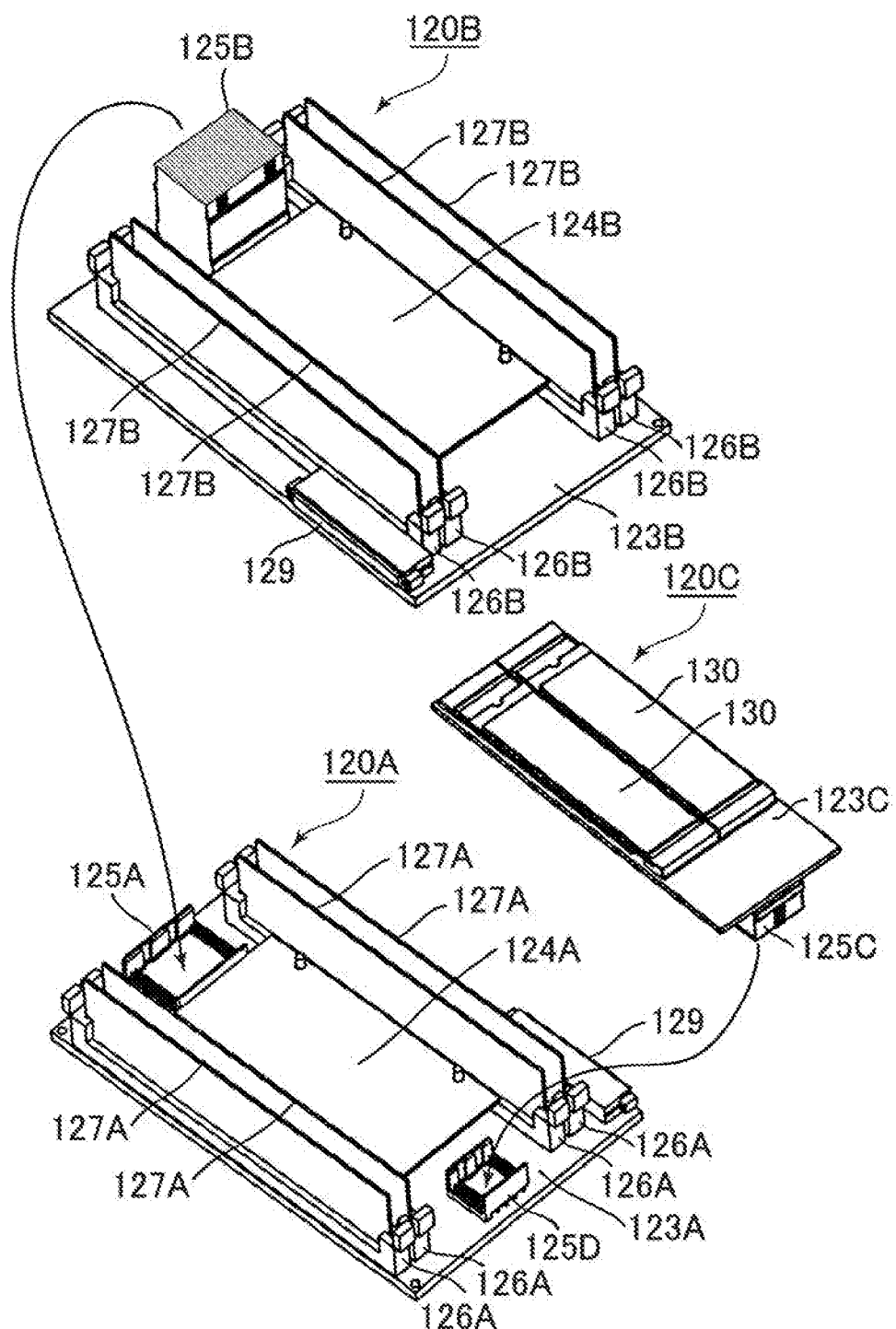
FIG. 4 is an assembly diagram illustrating an example of the processor module, and an assembly diagram of the first circuit substrate, the second circuit substrate, and the third circuit substrate.
Figure 5A:
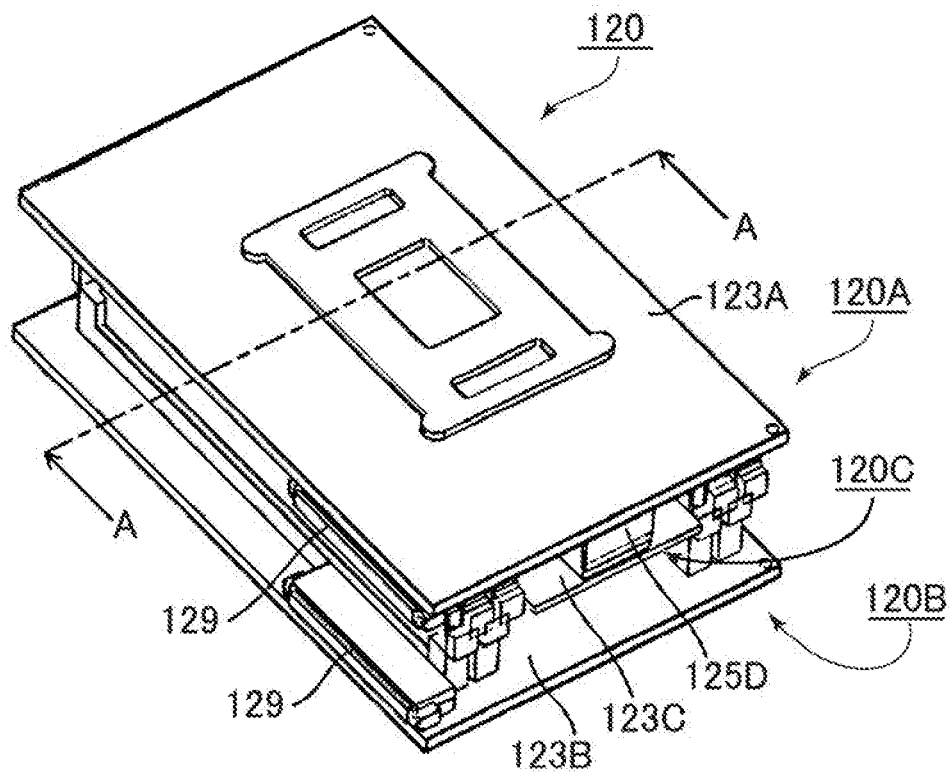
FIG. 5A is a perspective diagram illustrating an example of the processor module.
Figure 5B:
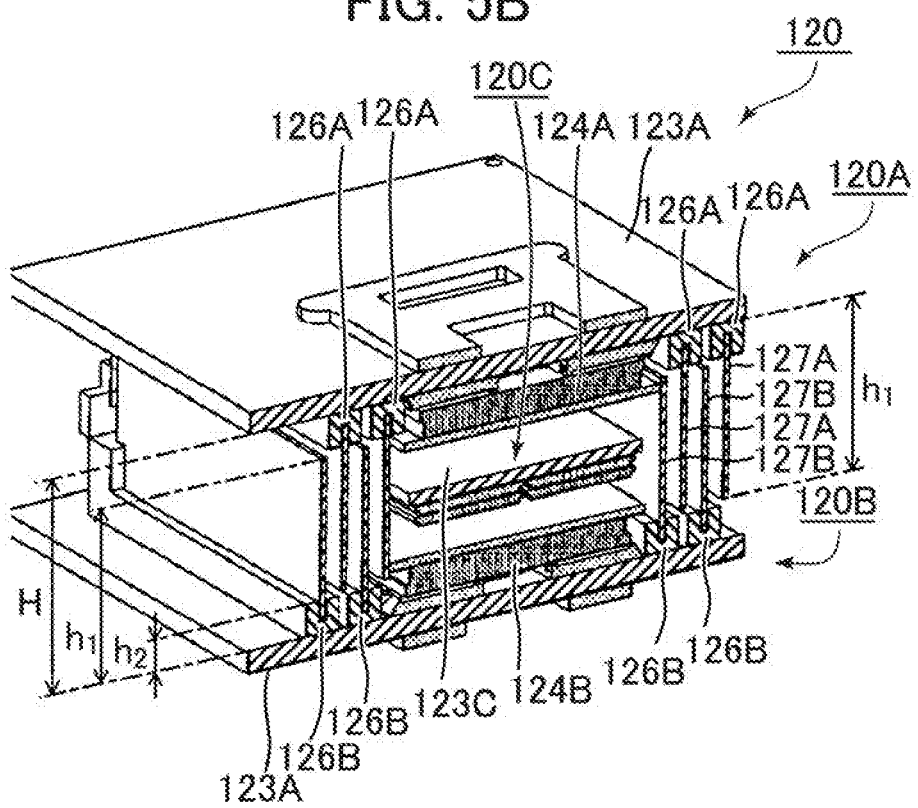
FIG. 5B is an A-A cross sectional view of the processor module illustrated in FIG. 5A.

FIG. 4 is an assembly diagram of the processor module 120 in combination of the A substrate 120A, the B substrate 120B, and the C substrate 120 C, FIG. 5A is a perspective diagram of the processor module 120, and FIG. 5B is an A-A cross sectional view of the processor module 120 illustrated in FIG. 5A. No illustration is made of the fins of the heat sink thermally connected to the upper surfaces of the processors 124A and 124B. To coincide with the flow direction of the cooling liquid, the arrangement direction of the fins of the heat sink may preferably be the same as that of the memory module, as will be described later. As illustrated in FIG. 4, according to the assembly method of the processor module 120, the connector 125C of the C substrate 120 C is coupled to the connector 125D of the A substrate 120A, and the B substrate 120B is turned over in a manner that one surface of the B substrate 120B is opposed to one surface of the A substrate 120A, to couple the connector 125B of the B substrate 120B with the connector 125A of the A substrate 120A. When the connectors 125A and 125B are coupled with each other, they are useful not only for aligning the A substrate 120A and the B substrate 120B, but also for keeping a predetermined length of a distance H between the one surface of the A substrate 120A and the one surface one of the B substrate 120, in a manner to alternately arrange the end parts of the comb-like arranged plurality of memory modules 127A of the A substrate 120A and the end parts of the comb-like arranged plurality of memory modules 127B of the B substrate 120B with clearances made between the adjacent memory modules.

By reference to FIG. 5B, as described above, the A substrate 120A and the B substrate 120B are aligned in a manner to alternately arrange the end parts of the comb-like arranged plurality of memory modules 127A of the A substrate 120A and the end parts of the comb-like arranged plurality of memory modules 127B of the B substrate 120B, with clearances between the adjacent memory modules. For example, the memory sockets 126A can be arranged in a manner that the distance between the center lines is approximately 8 mm. The general 64 GB DIMM has a standard height approximately 30 mm and a thickness approximately 3 mm. Thus, when the memory module 127A and the memory module 127B are alternately arranged, the clearance between the adjacent memory modules is approximately 1 mm (=(8−3−1.5*2)/2). The amount of heat from the memory modules is far lower than the amount of heat from the processor. Thus, even if the clearances between the adjacent memory modules are narrow at this level, a heat-absorbing action using the cooling liquid is not impaired.

As illustrated in FIG. 5B, the distance H between the one surface of the A substrate 120A and the one surface of the B substrate 120B can be made short in a manner that a "$(h_1+h_2)<H<2h_1$" is satisfied where "$h_1$" is a height of the memory modules 127A and 127B from the one surface, and "$h_2$" is a height of the memory sockets 126A and 126B. For example, because the height of the memory sockets 126A and 126B for the general 64 GB DIMM with a standard height is approximately 5 mm, the distance H can be made short up to 36 mm to 40 mm, thereby enabling to realize further high density mounting. For example, when the distance H is set at approximately 40 mm, and the height of the processor (including the fins of the heat sink) from one surface of the substrate is set at approximately 15 mm, the space which is produced between the oppositely arranged upper surfaces of the processors 124A and 124B has a height approximately 10 mm (=40−15*2). The space with the height approximately 10 mm produced in the processor module 120 has a sufficiently enough size (if the space has its half height approximately 5 mm, it is quite difficult to arrange the constituent parts therein due to the too low height) for additively arranging various constituent parts for expanding or enhancing the functions of the processor module. The C substrate 120C is another circuit substrate, for expanding or enhancing the functions and arranged in this space. Needless to say, if this height is obtained, it is possible to attain, without any problem, the clearance between the upper surface of the processor 124A of the A substrate 120A and the back surface of the C substrate 120C and the clearance between the upper surface of the processor 124B of the B substrate 120B and the surface of the C substrate 120C. Thus, there is no problem to attain a desired heat-absorbing function using a cooling liquid passing therethrough.

Back to FIG. 2, for more detailed descriptions of the configuration of the electronic device 100, a plurality of sliders (not illustrated) may be attached in the longitudinal direction of the outer frame section 110*b* of the backboard 110, on the opposite surface of the one surface of the backboard 110. A pair of sliders attached on both sides of the outer frame section 110*b* are engaged with rail grooves provided on adjacent support columns vertically fixed and standing in a cooling tank, as will be described later. As a result, the backboard 110 may slidably (upward and downward in a vertical direction) be supported.

By sliding the backboard 110 against the plurality of support columns, when the electronic device 100 having the above configuration is directly cooled and immersed in the cooling liquid inside the cooling unit, the cooling liquid passing through inside the electronic device passes inside and outside the processor modules 120 to absorb heat rapidly and efficiently from the processor module 120 and the carrier substrate 121, thereby ensuring stable operations of the electronic device 100 even in high density mounting. At this time, secured clearances in the processor module 120 are a clearance between the A substrate 120A and the C substrate 120C, a clearance between the B substrate 120B and the C substrate 120C, and a clearance between the adjacent memory modules. As described above, these clearances forma flow channel through which a cooling liquid passes. Each of the processor modules 120 can be attached to the carrier substrate 121, and in addition can be detached from the carrier substrate 121. Thus, for each processor module 120, adjustment, checking, repair, exchange, and extension can be performed. This enables to significantly improve the maintainability.

Figure 6:
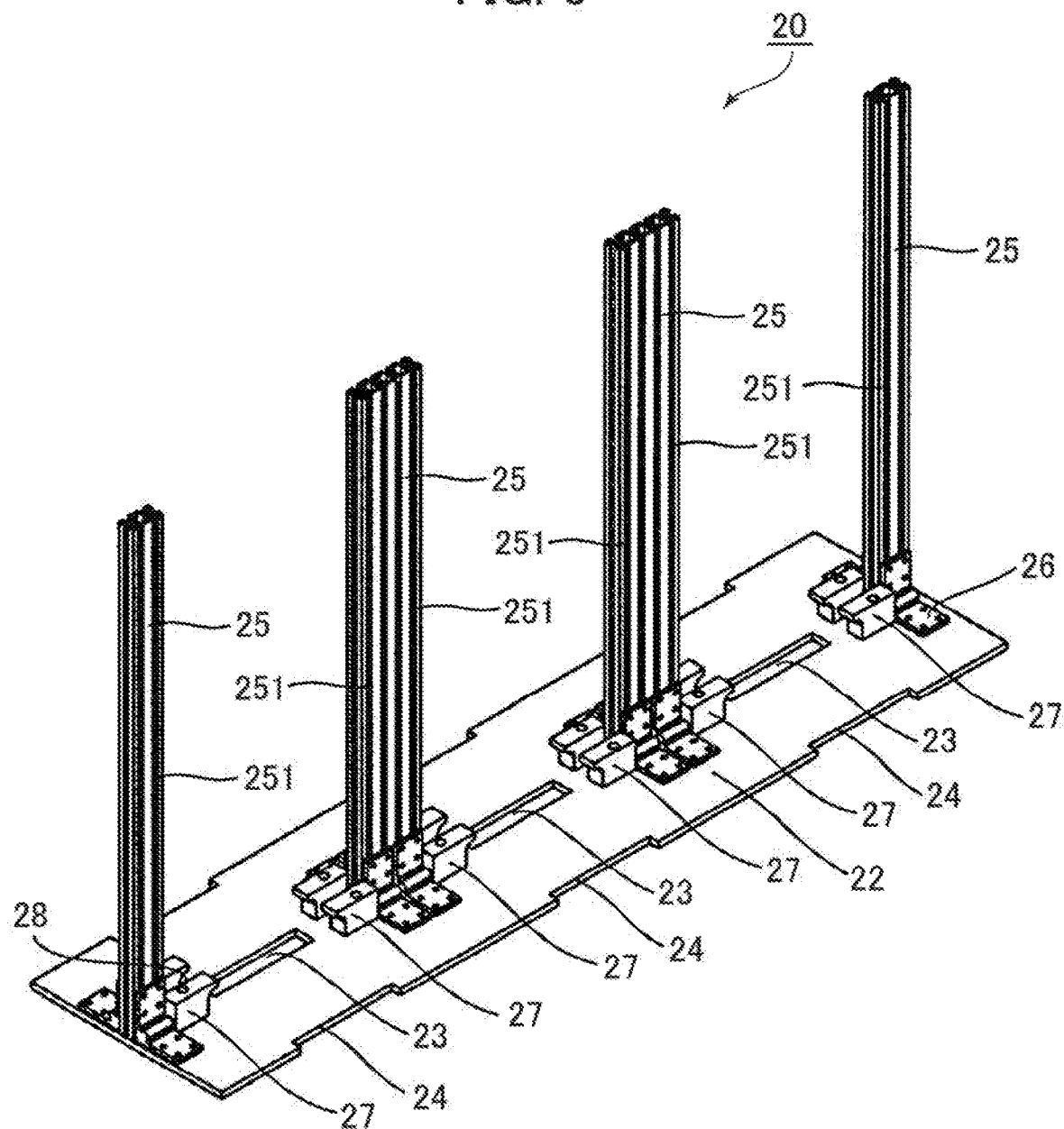
FIG. 6 is a perspective diagram illustrating an example of a stage in a power supply unit.
Figure 7:
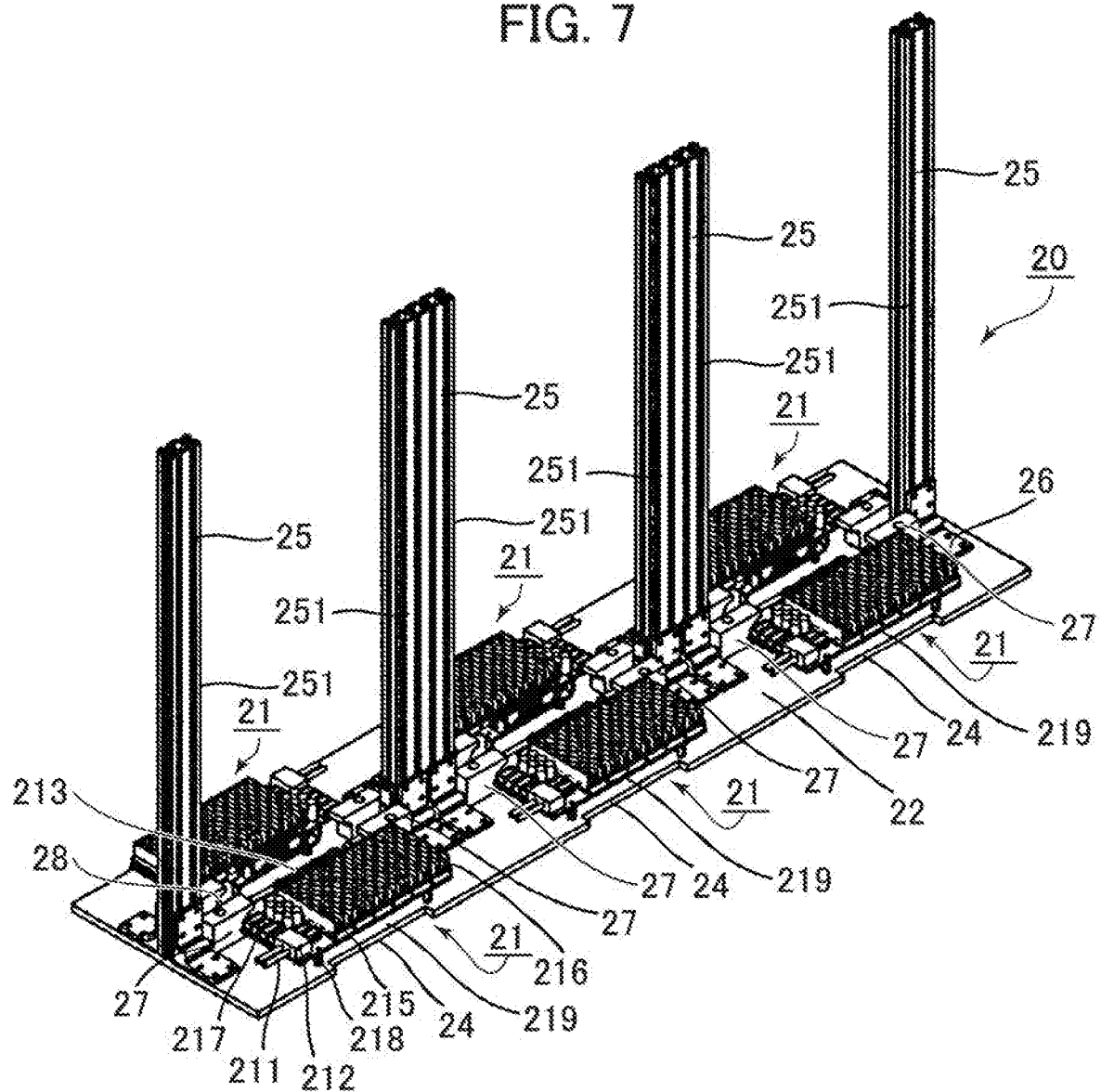
FIG. 7 is a perspective diagram illustrating a state in which a unit substrate of the power supply unit is mounted on the stage.
Figure 8:
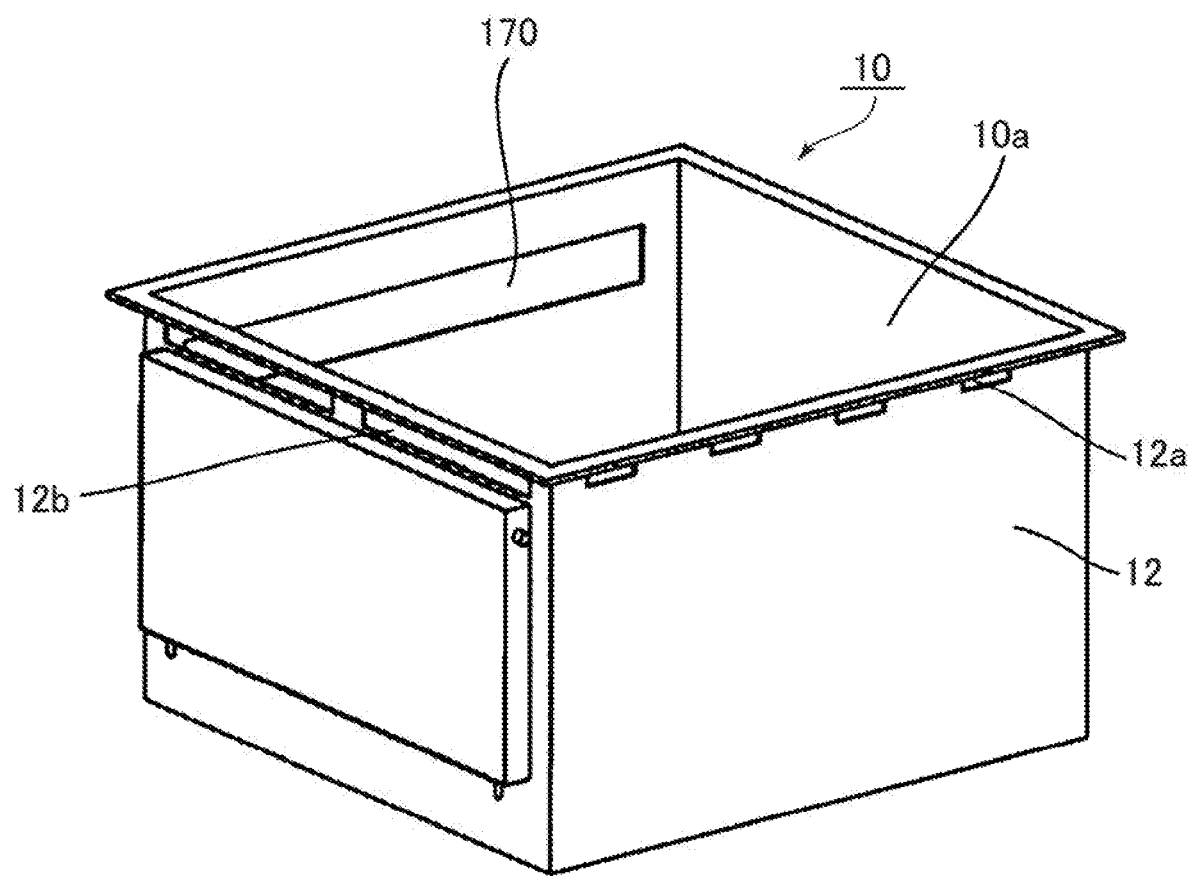
FIG. 8 is a perspective diagram of a cooling tank included in a cooling device, in a cooling system according to the embodiment of the present invention.
Figure 9:
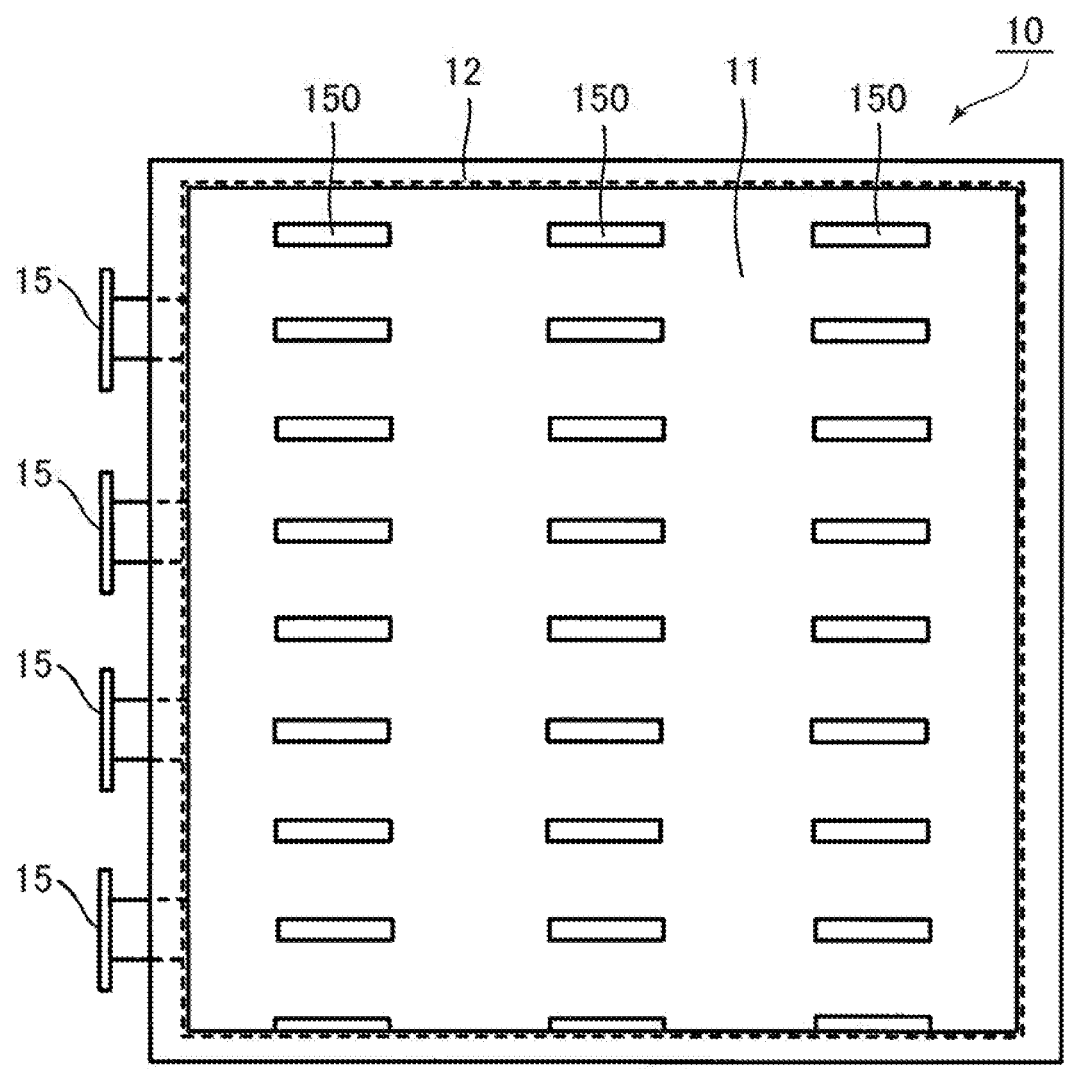
FIG. 9 is a plan view of a cooling tank included in the cooling device, in the cooling system according to the embodiment of the present invention.

Descriptions will now be made to a power supply unit 20 provided in the lower section of the cooling device by reference to FIG. 6 to FIG. 7. FIG. 6 is a perspective diagram illustrating an example of a stage 22 in a power supply unit 20. FIG. 7 is a perspective diagram illustrating a state in which a unit substrate 21 of the power supply unit 20 is mounted on the stage 22.

As described, the power supply unit 20 is a constituent part excluded from the electronic device 100, and provided on the bottom section of the cooling tank included in the cooling device. The power supply unit 20 includes the unit substrate 21 and a step-down device 215 mounted on the unit substrate 21. The unit substrate 21 includes a power supply voltage input connector 212 and a DC voltage output connector 213. The connector 212 supplies an external power supply voltage from an external power supply (not illustrated) through a power supply cable 211. The DC voltage output connector 213 outputs a DC voltage stepped down by the step-down device 215. The step-down device 215 may include a converter module which steps down an external high voltage value DC voltage, for example, between 200 V and 420 V into a DV voltage between 24 V and 52 V, or a converter module which performs AC-DC conversion for and steps down an external high voltage AC single-phase or three-phase voltage between 100 V and 250 V into a DC voltage between 24 V and 52 V. The former converter module may preferably steps down, specifically, from DC 380 V to DC 48 V. The latter converter module may preferably perform AC-DC conversion for and step down from AC 200 V to DC 48 V. If necessary, the step-down device 215 may include one or two or more peripheral circuits, of a power factor circuit, a noise filter, an additional rectifier, and a surge circuit. The surface of the step-down device 215 is thermally connected to a heat sink 216 for heating. The unit substrate 21 may include a plurality of fuses 217 which perform protection at failure. As illustrated in FIG. 7, the unit substrate 21 is fixed on the stage 22 through a plurality of spacers 218. As a result, the unit substrate 21 is arranged apart from the bottom section, in a manner to form a flow channel 219 through which a cooling liquid passes between one surface of the unit substrate 21 and the bottom section of the cooling tank, as will be described later. The unit substrate 21 may be configured to have a flow channel through which the cooling liquid passes. For example, the unit substrate 21 may be formed with a hierarchical structure or a hollow structure having an intermediate space in which the cooling liquid passes.

As illustrated in FIG. 6, the stage 22 includes a flat plate put on the bottom section of the cooling tank, as will be described later. Close to the center of the flat plate in its width direction, a plurality of holes 23 for passing the cooling liquid flowing from the bottom section are formed apart with a space in the longitudinal direction. On the end part of the flat plate in its width direction, a plurality of cutouts 24 are formed at predetermined intervals in the longitudinal direction. The adjustment cutouts 24 have a length and a width which are necessary for forming substantially the same hole as the holes 23 by putting the adjacent cutouts 24 together, when the plurality of stages 22 are parallelly arranged. On the stages, a plurality of support columns 25 are vertically attached, using L-shaped brackets 26. When the stages 22 are provided on the bottom section of the cooling tank, the plurality of support columns 25 vertically stand up in the cooling tank. On the stages 22, the plurality of brackets 27 are fixed. In the brackets 27, a support pin insertion hole 28 is formed.

Rail grooves 251 are formed in each of the plurality of support columns 25. If a pair of sliders (not illustrated) formed in the backboard 110 of the electronic device 100 are engaged with the rail grooves 251 formed in the adjacent support columns, the backboard 110 is slidably (upward and downward in a vertical direction) supported.

For the power supply unit 20 having the above configuration, the electronic device 100 can cause the backboard 110 to move upward and downward by sliding again the plurality of support columns 25. When the electronic device 100 is moved downward, a pair of support pins (not illustrated) extending downward from the lower section of the external frame section 110b of the backboard 110 of the electronic device 100 are inserted into support pin insertion holes of a pair of brackets 27 fixed onto the power supply unit 20. As a result, it is preferable to accurately align the DC voltage output connector 213 of the power supply unit 20 with the DC voltage input connector 131 of the electronic device 100. If the electronic device 100 is further moved downward, the DC voltage output connector 213 and the DC voltage input connector 131 are electrically connected. At this time, a pair of support columns 25 and a pair of brackets 27 support the weight of the electronic device 100 of one unit.

The power supply unit 20 may further include a first controller which starts supplying a DC voltage to the electronic device 100, upon detection of a state in which the DC voltage output connector 213 is engaged with the DC voltage input connector 131 of the electronic device 100. The first controller may be mounted on the unit substrate 21 as an additional circuit or an electronic mechanism. As a result, the electronic device 100 is moved downward in the cooling tank and engaged with the power supply unit 20, thereby enabling a plug-in operation of the electronic device 100, that is an immediate electric conduction operation.

The power supply unit 20 may further include a second controller which detects ON/OFF in accordance with an operation from the control panel which is provided on the upper part of the liquid level of the cooling liquid in the cooling tank, or on the wall surface structure section of the cooling tank, or near the cooling tank, to switch between start/stop supplying a voltage to the electronic device 100. Then, the operator can manually switch between ON/OFF for each electronic device 100, thereby improving the maintainability. The second controller can also be mounted on the unit substrate 21 as an additional circuit or an electronic mechanism.

The switch for transmitting a signal for switching between start/stop supplying a voltage to the electronic device 100 to the second controller may be provided on the upper end or the side surface of each of the plurality of support columns 25.

Descriptions will now be made to an example of a liquid immersion-cooled device for directly cooling and immersing the above-described electronic device 100 according to the one embodiment of the present invention and the above-described power supply unit, in the cooing liquid, by reference to the drawings. In the following descriptions, descriptions will be made to a configuration of a high density liquid immersion-cooled device which stores and cools down totally 24 units of the electronic device 100 and the power supply unit 20, respectively in "6*4" sections of the cooling tank. This is simply an example, and the number of units of the electronic devices in the high density liquid immersion-cooled device, thus is not at all to limit the configuration of the electronic device which can be used as the present invention.

By reference to FIG. 8 to FIG. 11, the liquid immersion-cooled device 1 according to the embodiment has a cooling tank 10. In the cooling tank 10, an open space 10a is formed by a bottom wall 11 and a side wall 12. Formed in the bottom wall 11 are a plurality of inflow openings 150 in which cooling liquid flows, in a pattern of "9*3". Formed in the side wall 12 are a power supply cable introducing port 12a, a network cable introducing port 12b, and an outflow opening 170 formed near the liquid level of the cooling liquid.

The liquid immersion-cooled device 1 has a top plate 10b for closing the open space 10a of the cooling tank 10. At the maintenance work for the liquid immersion-cooled device 1, the top plate 10b is removed from the opening part to open the open space 10a. At the operation time of the liquid immersion-cooled device 1, the top plate 10b is put on the opening part of the cooling tank 10 to close the open space 10a.

Figure 10:
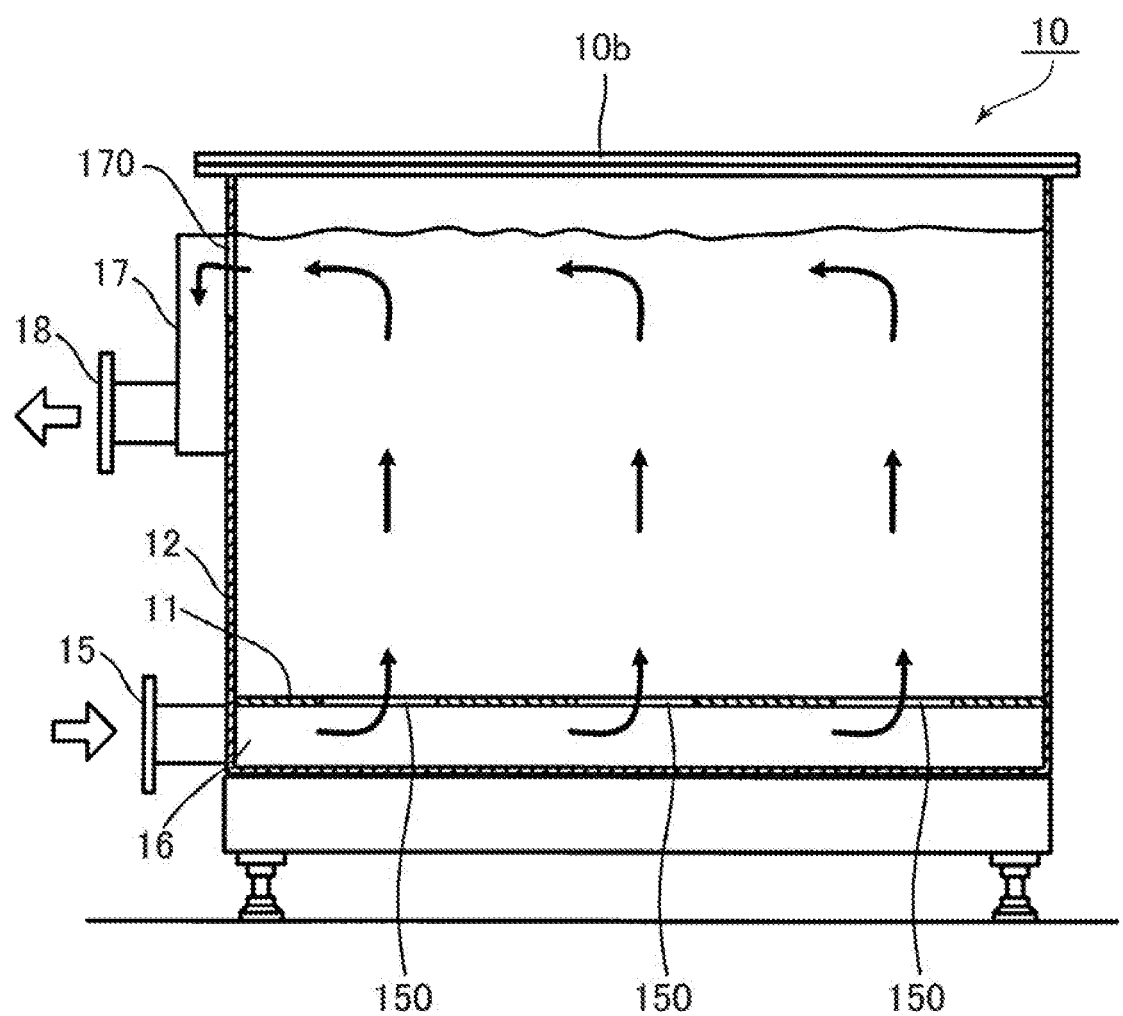
FIG. 10 is a partial cross sectional view of the cooling device, in the cooling system according to the embodiment of the present invention.

In the cooling tank 10, a sufficient amount of cooling liquid for immersing entirely the electronic device 100 is introduced up to the liquid level illustrated in FIG. 10 (see FIG. 10). The cooling liquid may preferably employ a fluorine-based inert liquid including a totally fluorinated compound (perfluorocarbon compound), known as "Fluorinert (a trademark of 3M, the same hereinafter) FC-72" (boiling point 56° C.), "Fluorinert FC-770" (boiling point 95° C.), "Fluorinert FC-3283" (boiling point 128° C.), "Fluorinert FC-40" (boiling point 155° C.), and "Fluorinert FC-43" (boiling point 174° C.). The cooling liquid, however, is not limited to the above. The boiling points of Fluorinert FC-40 and FC-43 are higher than 150° C., and are hardly evaporated. When they are used for the cooling liquid, the height of the liquid level in the cooling tank 10 is kept over a long period of time, thus they are quite advantageous.

Provided under the bottom wall 11 of the cooling tank 10 are a plurality of inflow headers 16 having an inlet 15 of a cooling liquid on its one end. Provided outside the side wall 12 of the cooling tank is a receiving part 17 having an outlet 18 for the cooling liquid. The receiving part 17 covers the outflow opening 170 to receive the cooling liquid flowing from the outflow opening 170 without leakage.

Figure 11:
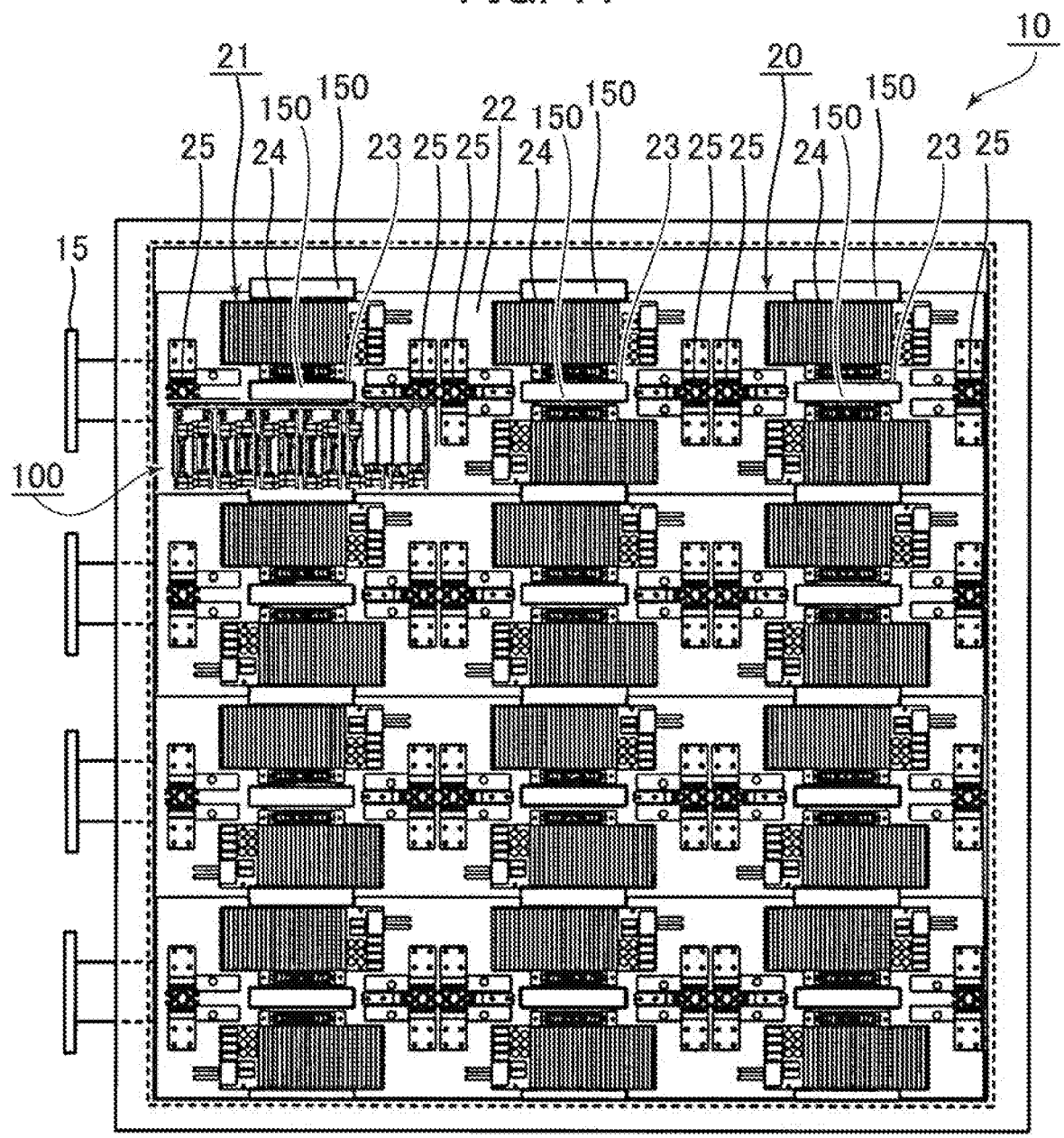
FIG. 11 is a plan view illustrating an example in which four stages with unit substrates mounted thereon are arranged side by side on the bottom of the cooling tank.

By reference to FIG. 11, four flat plate stages 22 are arranged on the bottom wall 11 of the cooling tank 10. Each of the plurality of holes 23 formed in the stage 22 and the holes, which are substantially the same as the holes 23 and formed by the joined adjacent cutouts 24, corresponds to each of the plurality of inflow openings 150 formed in the bottom wall 11. Thus, inflow of the cooling liquid flowing from the inflow openings 150 is not interrupted by the power supply unit 20. Because a flow channel for letting the cooling liquid flow is secured between the unit substrate 21 of the power supply unit 20 and the stage 22 (bottom wall 11), the cooling liquid absorbs heat from the both surfaces of the unit substrate 21 quickly and efficiently. Therefore, it is excellent in efficient cooling of the power supply unit 20. Further, because the unit substrate 21 of the power supply unit 20 can be put parallelly with the bottom wall 11 of the cooling tank 10, it is possible to have a lower height of the power supply unit 20 than that of the conventional case, in a height (depth) direction of the cooling tank 10. Thus, it is possible to shorten the length including both the electronic device 100 and the power supply unit 20, thereby enabling to set a low height (shallow depth) of the cooling tank 10.

In addition, the cooling liquid flowing from the inflow opening 150 quickly and efficiently absorbs heat from the processor module 120 and the carrier substrate 121, by flowing through from downward and upward of the electronic device 100 and inside and outside the processor module. The cooling liquid which has been heated in this manner reaches the outlet 18, through the outflow opening 170 and the receiving part 17. The outlet 18 is connected to a pipe (not illustrated) through a heat exchanger (not illustrated) up to the inlet 15. Therefore, the cooling liquid is cooled down by the heat exchanger, and then the cooled cooling liquid is supplied to the inlet 15.

INDUSTRIAL APPLICABILITY

The present invention is widely applicable to a liquid immersion-cooled processor module and electronic device mounted in high density.

LIST OF REFERENCE SIGNS 1 liquid immersion-cooled device
10 cooling tank
10a open space
10b top plate
11 bottom wall
12 side wall
12a power supply cable introducing port
12b network cable introducing port
100 electronic device
110 backboard or frame structure
110a hole
110b outer frame section
110c beam section
120 processor module
121 carrier substrate
122 network card
123A, 123B, 123C circuit substrate
124A, 124B, processor
125A, 125B, 125C, 125D connector
126A, 126B memory socket
127A, 127B memory module
128 module connector
129 module connector plug
130 storage device
PA, PB processor mounting area
MA, MB memory mounting area

The invention claimed is:
1. An electronic device which is directly immersed and cooled in a cooling liquid in a cooling device, comprising:
a carrier substrate which includes a voltage input end for supplying a DC voltage for the electronic device, the voltage input end being electrically connected to a voltage output end of a power supply unit;
a plurality of module connectors which are arranged on one surface of the carrier substrate;
a plurality of processor modules each of which has a module connector plug electrically coupled to each of the plurality of module connectors; and
a support member which supports the carrier substrate to be positioned in an upper section of the power supply unit arranged on a bottom section of a cooling tank included in the cooling device, when the electronic device is electrically connected to the power supply unit, and wherein
the processor module includes
a first circuit substrate and a second circuit substrate each of which has a processor mounting area and a memory mounting area on one surface thereof, each of which has at least one processor mounted in the processor mounting area, and each of which has a plurality of comb-like arranged memory modules in the memory mounting area, and which are in a state that the one surface of the first circuit substrate and the one surface of the second circuit substrate are combined face-to-face, and at least one connector which electrically connects between the first circuit substrate and the second circuit substrate, and the first circuit substrate and the second circuit substrate are positioned in manners, that the processor mounting area and the memory mounting area of the first circuit substrate are placed face-to-face respectively with the processor mounting area and the memory mounting area of the second circuit substrate, and that end parts of the plurality of comb-like arranged memory modules of the first circuit substrate and end parts of the plurality of comb-like arranged memory modules of the second circuit substrate are alternately arranged with clearances made between adjacent memory modules, wherein the support member includes a backboard or a frame structure on which the carrier substrate is fixed, and wherein the backboard or the frame structure is slidably supported by a plurality of support columns which stand up and are vertically fixed in the cooling tank.

2. The electronic device according to claim 1, wherein the memory mounting area includes a plurality of memory sockets for fixing individual memory modules, and a distance H of the one surface of the first circuit substrate and the one surface of the second circuit substrate satisfies $(h_1+h_2)<H<2h_1$ where "$h_1$" is a height of the memory module from the one surface, and "$h_2$" is a height of the memory socket.

3. The electronic device according to claim 1, wherein the memory module is a memory module with a standard height, and the memory module is inserted into the memory socket in such a manner that a substrate surface of the memory module is vertical to or oblique against the one surface.

4. The electronic device according to claim 1, wherein the processor of the first circuit substrate and the processor of the second circuit substrate are connected through an inter-processor connecting interface.

* * * * *